(12) United States Patent
Roylance (10) Patent No.: US 6,198,474 B1
(45) Date of Patent: Mar. 6, 2001

(54) COMPUTER KEYBOARD HAVING FULL-SIZED KEYS SUITABLE FOR TOUCH TYPING AND THUMB OPERABLE SPACE KEY ALSO ACTING AS A SHIFT KEY

(76) Inventor: William H. Roylance, 1654 Redondo Ave., Salt Lake County, UT (US) 84105

( * ) Notice: Subject to any disclaimer, the term of this patent is extended or adjusted under 35 U.S.C. 154(b) by 0 days.

(21) Appl. No.: 09/109,616

(22) Filed: Jul. 2, 1998

Related U.S. Application Data (60) Provisional application No. 60/052,750, filed on Jul. 2, 1997.

(51) Int. Cl.[7] .............................. G09G 5/00; G06F 13/00; H03K 17/94
(52) U.S. Cl. .............................. 345/168; 708/146; 341/22
(58) Field of Search .................................. 345/156, 168, 345/172, 173; 341/20, 21, 22, 23, 26, 30; 708/142, 144, 145, 146; 705/25; 400/251, 252

(56) References Cited

U.S. PATENT DOCUMENTS

| | | | |
|---|---|---|---|
| 4,823,294 | * 4/1989 | Rouhani | 341/23 |
| 4,891,777 | * 1/1990 | Lapeyre | 345/168 |
| 4,974,183 | * 11/1990 | Miller | 345/168 |
| 5,062,070 | * 10/1991 | Lapeyre | 708/146 |
| 5,184,315 | * 2/1993 | Lapeyre | 708/146 |
| 5,287,526 | * 2/1994 | Wolf et al. | 708/146 |
| 5,288,158 | * 2/1994 | Matias | 345/169 |
| 5,479,192 | * 12/1995 | Carroll, Jr. et al. | 345/168 |
| 5,574,447 | * 11/1996 | Roylance | 341/22 |
| 5,841,423 | * 11/1998 | Carroll, Jr. et al. | 345/168 |
| 5,935,225 | * 8/1999 | Peng et al. | 708/146 |
| 5,949,643 | * 9/1999 | Batio | 345/168 |
| 6,014,092 | * 1/2000 | Darbee et al. | 341/23 |

\* cited by examiner

*Primary Examiner*—Steven J. Saras
*Assistant Examiner*—Paul A. Bell
(74) *Attorney, Agent, or Firm*—Mallinckrodt & Mallinckrodt; Brian R. Rayve; Robert R. Mallinckrodt (57) ABSTRACT

A compact electronic keyboard having full-size keys arranged in the standard QWERTY or DVORAK pattern but with a reduced width of the keyboard due to the elimination of the standard modifier keys normally positioned at opposite sides of the alphanumeric keys. The function of such modifier keys are incorporated into some of the alphanumeric keys, or modifiable character keys, the function of which is controlled by means of separate portions of a split, thumb-operable spacebar below the lower row of alphanumeric keys. Such portions are the space key and the special key. The space key incorporates the standard shift function and can control the function of the modifiable character keys by simultaneous pressing of the space key and the desired modifiable character key. The special key can control the function of the modifiable character keys in a similar manner, but which can remain activated for a preset period of time such that simultaneous pressing of a modifiable character key is not necessary. The function of the modifiable character keys can also be controlled by pressing and holding the key for a preset period of time. The keyboard can be used for pocket computers and on full-size computer keyboards for more efficient typing.

23 Claims, 5 Drawing Sheets

COMPUTER KEYBOARD HAVING FULL-SIZED KEYS SUITABLE FOR TOUCH TYPING AND THUMB OPERABLE SPACE KEY ALSO ACTING AS A SHIFT KEY

This APPLICATION CLAIMS benefit to U.S. Provisional application Ser. No. 60/052,750 filed Jul. 2, 1997.

BACKGROUND OF THE INVENTION

1. Field

The invention relates to methods and apparatus for entry of characters on a computer keyboard, and specifically relates to methods and apparatus for selecting among a plurality of various cases, or functions, controlled by individual keys.

2. State of the Art

Typical manual typewriters have a multiplicity of type bars, each of which is mechanically linked to a key. Keys and type bars are made to do double duty by forming two characters on each type bar. A "shift" key repositions the entire array of type bars to determine whether the first or the second character on the type bars is to be imprinted on the paper. The array of type bars is repositioned into the normal position by a spring when the shift key is released. Typing an upper-case key therefore requires that the shift key first be depressed, then second that the desired letter key be struck while the shift key is still depressed. A separate "shift lock" key often is used to lock the type bars in shifted position, and maintain them in that condition until released by a separate act of the user.

Many features of today's standard computer keyboards are traceable to the characteristics of such manual typewriters. Among these features is the QWERTY layout ("QWERTY" being the letters generated by the six upper left alphabetic keys) and the requirement that a "shift" key be pressed and held while a character key is struck to generate an upper case character. The "shift" key therefore selects between two cases or functions of the character key, where each case or function generates a unique character code when activated.

Many keyboards also have one or more "control" "function" or "alt" keys that change the function or character of keys struck while the said "control" "function" or "alt" key is held in a manner similar to the operation of the "shift" key. The "control", "function", "alt", and "shift" keys are all key-modifier keys, while the key having a function that is altered by the key-modifier key may be referred to as the modifiable key.

Generally, the key-modifier keys of a standard QWERTY-layout keyboard are located at the sides of a keyboard where they are struck with the little finger. There are many people with limited hand mobility who find that operating these keys with the little finger is awkward. Additionally, the placement of key-modifier keys on many keyboards is such that simultaneous operation of key-modifier keys and modifiable keys is difficult for those who have limited hand mobility, who type with one hand, or who type with a mouthstick.

Northgate sells a keyboard having an operating mode in which key-modifier keys alter the function of the first modifiable key struck following activation of the key-modifier key. The key-modifier function is then automatically cleared such that the function of the second following modifiable key is not altered by the key-modifier key. This is a "sticky" key-modifier key. The Northgate keyboard has the key-modifier keys located in the conventional locations, and has an operating mode in which the key-modifier keys behave conventionally.

Many users of keyboards have been trained to "touch type". Such users typically begin typing by placing the four fingers of the left hand over the A, S, D, and F keys, with the thumb over the spacebar, and the four fingers of the right hand over the J, K, L, and; keys, with the thumb over the spacebar, known as the "home position". The alphabetic keys are operated by moving the finger in the nearest column to the appropriate key arrangement of the letter keys, and requires learned motions to strike them such that such persons type by feel without looking at the keyboard while they type.

Touch-typists at their maximum speed require not only the arrangement of letter keys on a keyboard to match the standard keyboard for which they are trained, whether that standard be the QWERTY or DVORAK layouts, but that the size and spacing of the keys also be standard. Touch-typists find that the nonstandard, tiny keys of many pocket organizers and pocket computers are very difficult to use.

Touch-typing becomes substantially more difficult if the key pitch, or the center to center spacing of keys on the keyboard is less than 16 millimeters in the horizontal direction. Some studies, such as that cited in the March, 1993 Computer Shopper on page 346, in the sidebar entitled "Keyboard Size: How Small is Too Small", show that the smallest desirable key pitch for easy acceptance by touch-typists is approximately seventeen and eight-tenths millimeter center-to-center horizontally. Desktop computers generally have an eighteen to nineteen millimeter key pitch between horizontally adjacent keys, as specified in ANSI standard HFS 100-1988, with nineteen millimeters being the most common. The key pitch specified by the standard is eighteen to twenty-one millimeters in the vertical direction.

The standard keyboard layout also provides a single space bar reachable with either thumb. Touch-typists are often trained to hit the spacebar with only one thumb, the remaining thumb being unused while typing.

There are keyboards on the market that have separate spacebars intended for use by each thumb separately. These keyboards include the "ergonomic" keyboards that have the keyboard array split between the "G" and "H" keys, with the halves rotated to permit keeping the wrists straight while typing. While these "ergonomic" keyboards have separate spacebars for each thumb, these spacebars generate the same encoded character, a space.

Some touch-typists will accept keyboards with nonstandard size, spacing, and location for key modifier, function, special character, and numeric keys more readily than they will accept nonstandard alphabetic key locations. Such typists will accept these because there are many different standards for the locations and sizes of key modifier, function, and special character keys, and because these keys tend to be among those used less often.

Modern keyboards use an electronic device to scan the array of keys to detect when a key is struck and for generating a key code specific to the key struck. This electronic device may, but need not, be located on the same circuit board as the array of keys. This electronic device may comprise dedicated electronic circuitry or may comprise a small microprocessor programmed to scan the array. The microprocessor translates the key code into a standard key code format and communicate the translated key code to the computer, often serially. Alternatively, the processor of an organizer or portable computer can be programmed to scan the keys.

Many electronic devices for scanning the array of keys operate by driving a first voltage on a row line common to a plurality of key switches. There is more than one row line, the remaining row lines resistively connected to a second voltage, as is a plurality of column lines. Each key switch in a row connects to a different column line. When a key switch is activated, and the associated row line is driven to the first voltage, the first voltage being coupled onto, and which may be sensed on the associated column line. Each key is therefore defined by the intersection of a row and a column. The keyboard is scanned by driving the first voltage on each of the row lines sequentially, while monitoring the column lines. This technique permits the keyboard scanning device to correctly identify at least two simultaneously active keys, possibly more depending upon their location in the key array.

Electronically scanned keyboards also may have a diode in series with each key switch. Diodes allow the scanning device to correctly identify all active, or struck, keys even if several keys are struck simultaneously. Keys, such as the "shift", "control" and "alt" keys, that are intended to be struck simultaneously with other keys, may have such diodes and be located in their own row or column so as to ensure that they are correctly recognized despite whichever other keys are struck.

SUMMARY OF THE INVENTION

Modern electronics offers the possibility of selecting among alternative functions of keys in ways that were not practical on a manual typewriter. Further, the single space bar of a standard keyboard does not effectively utilize the full dexterity of human thumbs.

This invention splits the spacebar of a QWERTY keyboard layout into a plurality of keys reachable with the thumbs when the hands are in the home position, these keys referenced herein as spacebar portions. One of these spacebar portions retains the function of the standard keyboard spacebar, although it acquires some additional functions, and is herein referenced as the "space key". Another spacebar portion is herein referenced as the "special key". The "space key" and the "special key" are used in concert with the alphanumeric keys of the keyboard to provide key-modifier, macro, and special character functions.

The keyboard has a key pitch of at least sixteen millimeters, and preferably a key pitch of either seventeen and eight-tenths or eighteen millimeters between horizontally adjacent keys, with the possible exception of one or two keys at the extreme sides of the keyboard.

As some touch-typists habitually strike the spacebar with their left thumb, and others with their right thumb, the mapping of the spacebar into portions comprising the space key and the special key is preferably configurable and switchable by the user.

The space key when struck alone generates a space. When the space key is struck simultaneously (or chorded) with a modifiable character key, one of two actions takes place depending on which of the keys was first struck. If the modifiable character key was the first struck, the keyboard generates a shifted version of the character, as if a traditional shift key were struck with the character key. If the space key was the first struck, the keyboard generates a special function not normally associated with that character key.

The special key when struck simultaneously with a second or character key alters the function of that second key to generate the same special function as when the shift key is first struck and held while the character key is struck. The special key therefore is a key-modifier key. The special key is preferably user configurable to be a sticky key-modifier key, wherein the special key will alter the function of the second or modifiable character key even if the special key is released within a user-configurable time interval prior to activation of the second key instead of generating spaces.

In the preferred embodiment, one of the combinations of an alphanumeric key with the special key acts as a num-lock key. This num-lock function may also be generated by striking and holding the spacebar while striking the same alphanumeric key. This combination toggles a num-lock mode wherein a group of keys are redefined as a numeric pad for those users used to 10-key operation. When active, this num-lock mode remains in effect until turned off by the user, a user-configurable time interval expires from the last keypress, or until the keyboard is reset.

Additionally, the keyboard has the ability to generate macros, or frequently used strings of characters, such as the character strings "http://", "www.", ".com", and ".net". Macros are activated by striking the special key twice while a modifiable character key associated with the macro is held active. Some common macros are programmed into the keyboard at manufacture, others may be configured by the user.

In an alternative embodiment, the space key operates to generate a space. The special key acts as a sticky shift key, wherein a simultaneous (chorded) strike of an alphanumeric key, or a strike of an alphanumeric key within a user configurable timeout interval of a strike of the special key, acts to produce the standard shifted function of the alphanumeric key. In this embodiment, an additional or special function of modifiable character keys is engaged by striking and holding the modifiable character key for a time exceeding a user configurable timeout interval. For example, holding the "N" key for more than half a second causes activation of the num-lock mode without generation of an "n" character. To assist users in learning to use the keyboard, a signal such as a light emitting diode (LED), or sound is provided to indicate when the user configurable timeout interval has been exceeded.

In a second alternative embodiment, the space key and special key each struck alone operate to generate a space. The space key also acts as a shift key, wherein a simultaneous (chorded) strike of the space key and a modifiable character key, acts to produce the standard shifted function of the modifiable character key. In this embodiment, an additional or special function of modifiable character keys is engaged by a simultaneous (chorded) strike of the special key and the modifiable character key.

By utilizing the dexterity of the human thumb in the manner disclosed it is possible to construct a keyboard that is narrower than the usual eleven inch width while allowing for touch-typing because the key-modifier and special character keys usually located at the sides of the keyboard can be mapped into the QWERTY portion of the key array via the special key.

The present invention therefore permits construction of a compact pocket organizer or pocket computer that has the standard key spacing and layout of the alphabetic section that is desired by touch-typists.

THE DRAWINGS

The best mode presently contemplated for carrying out the invention is illustrated in the accompanying drawings, in which.

DETAILED DESCRIPTION OF THE ILLUSTRATED EMBODIMENT

The preferred embodiments of the keyboard comprises a microcontroller 11 (FIG. 1), having eight row-select outputs 12 driven by an output port 13, eight column indicating inputs 14 feeding an input port 15, a serial interface 16 to a host computer (not shown), a processor 17, a program memory 18, and a random access memory 19. There are many suitable microcontrollers available, including various members of the Motorola 6805 and Microchip PIC-16 families.

Figure 1:
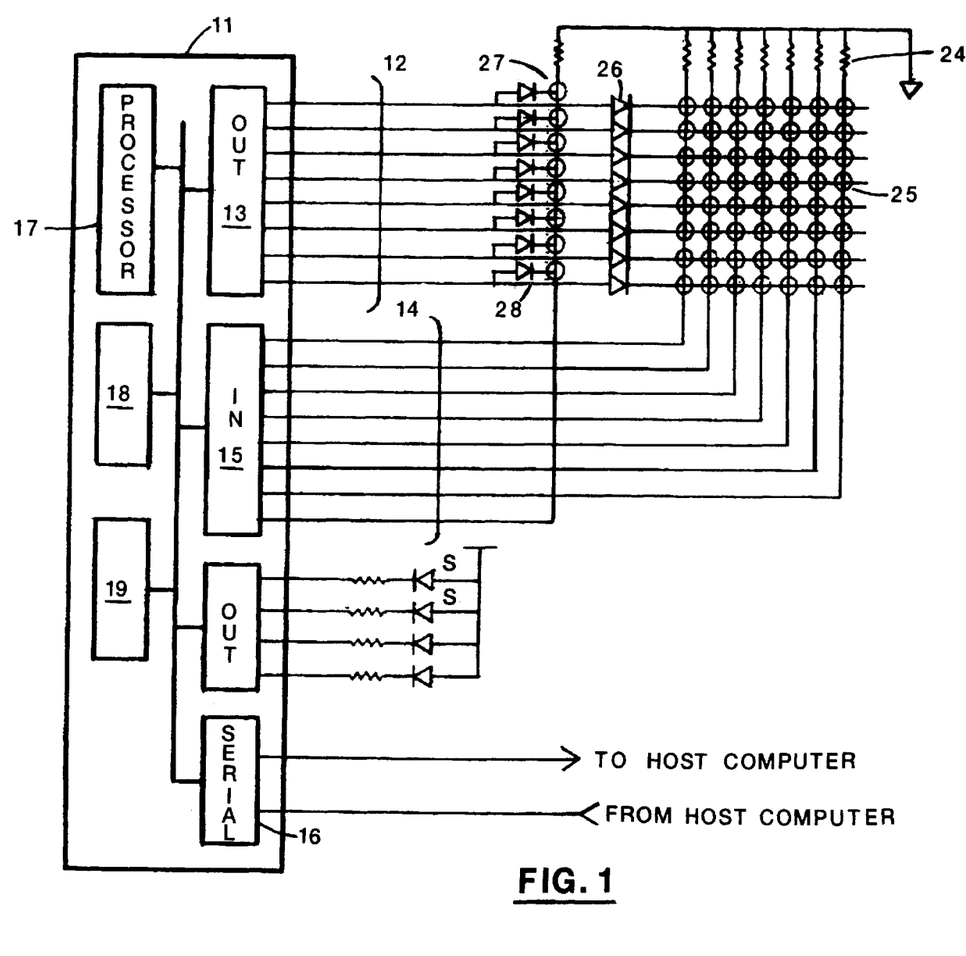
FIG. 1 is a schematic diagram of a keyboard according to the present invention.
Figure 2:
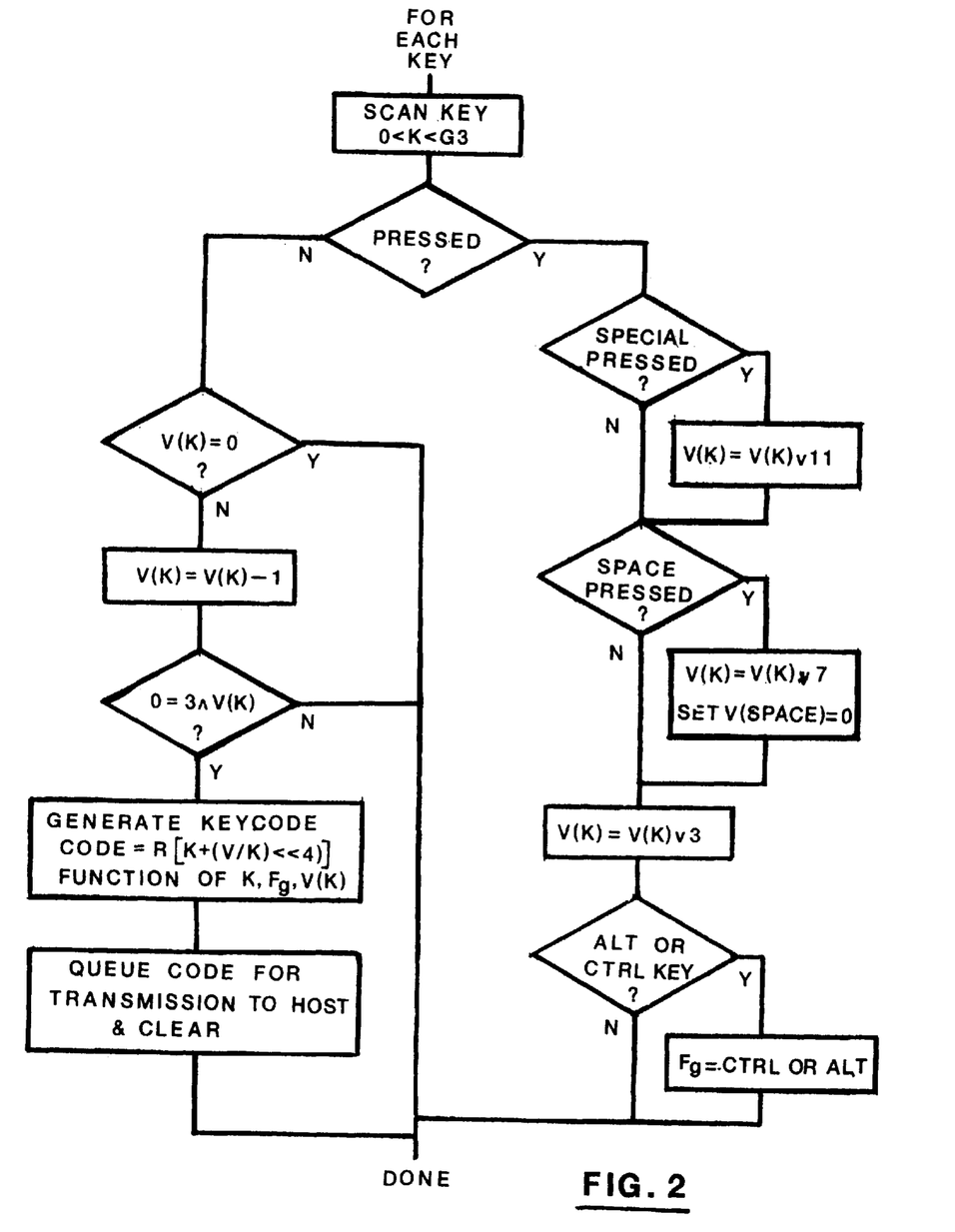
FIG. 2, a flowchart of microcontroller code showing how the function of a key is altered depending upon the presence of a simultaneously pressed space or special key of the preferred embodiment.

The preferred embodiment further comprises resistors 24 that act to pull down the column indicating inputs 14, an array of alphanumeric keys 25 that when pressed connect the row select outputs 12 through blocking diodes 26 to the column indicating inputs 24 of the microcontroller 11, and shift, space, special, and key-modifier keys 27 that when pressed couple row select outputs 12 through diodes 28 to the column indicating inputs 14 of the microcontroller 11. In this manner, the microcontroller may detect any combination of simultaneously struck shift, space, special, and a key-modifier keys 27 with one or two alphanumeric keys 25.

The microcontroller executes a program from its program memory that causes it to place a positive voltage on one row select line, while placing a low voltage on all of the other row lines. The microcontroller then reads the column sense lines to determine which, if any, keys are presently struck in this row, then repeats the process of reach of the other row select lines. In this way, the microcontroller 11 scans the keys and uniquely identifies any combination of pressed shift, space, special, and key-modifier keys 27 with any zero, one, or two simultaneously pressed alphanumeric keys 25. This key-scanning process repeats approximately once every ten milliseconds.

The microcontroller maintains a value in memory corresponding to each key. Initially all these values are set to zero. Whenever a key is scanned and found to be pressed, the value is set to a hexadecimal three OR'ed with the current value in memory corresponding to that key. Each time the key is scanned and found to not be pressed, the value in decremented, stopping at zero.

Figure 3:
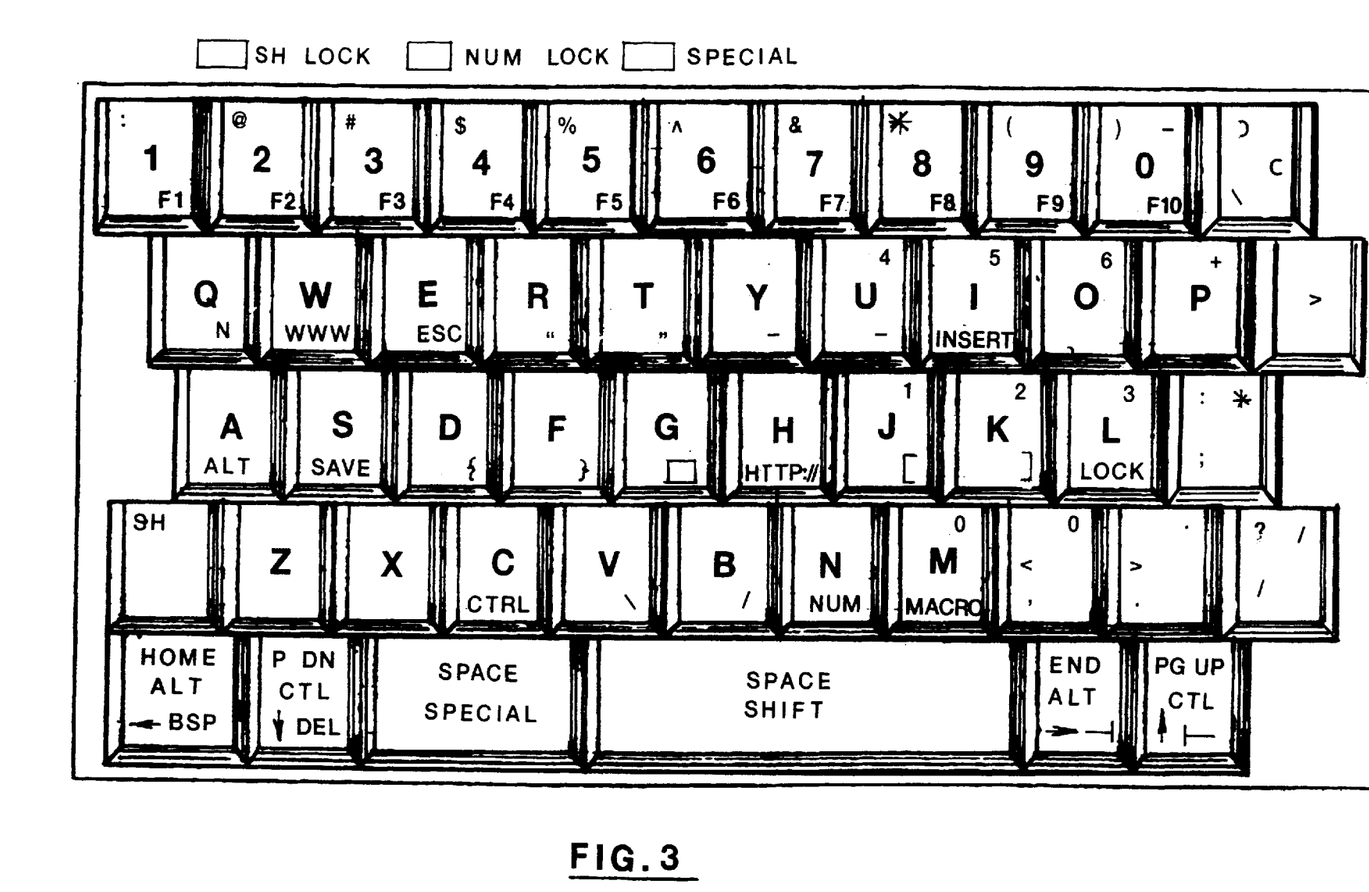
FIG. 3, a key layout of a compact keyboard according to the preferred embodiment of the present invention, wherein the lower case of the character on the left of each key is generated without special or shift functions, the character on the upper left with shift only (where not shown the character generated is the upper case of the left side character), the character at the bottom right is generated in conjunction with the special, the character at the top right is generated in numeric pad mode, and the spacebar is split into space and special keys.
Figure 4:
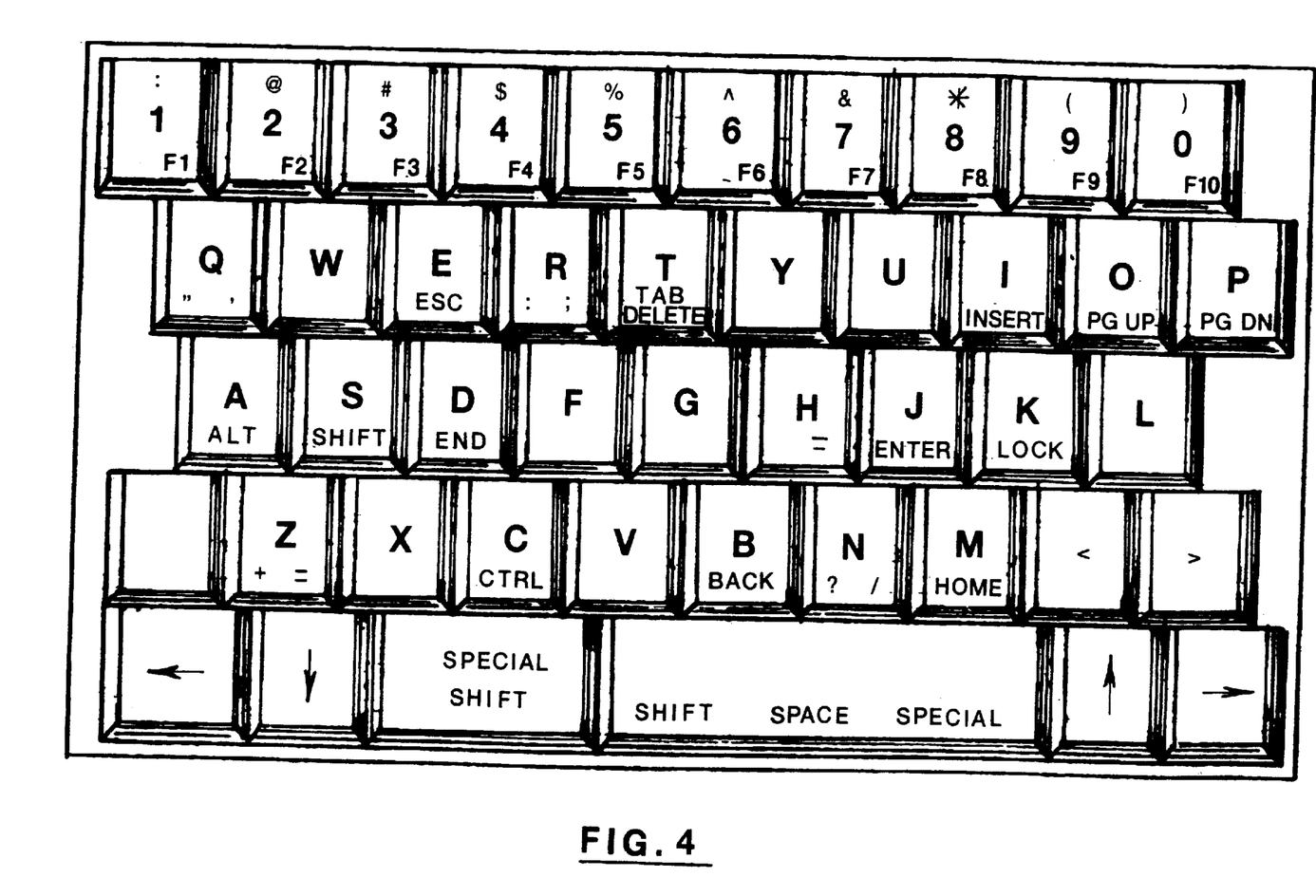
FIG. 4, a key layout of a compact keyboard according to an alternative embodiment of the present invention.
Figure 5:
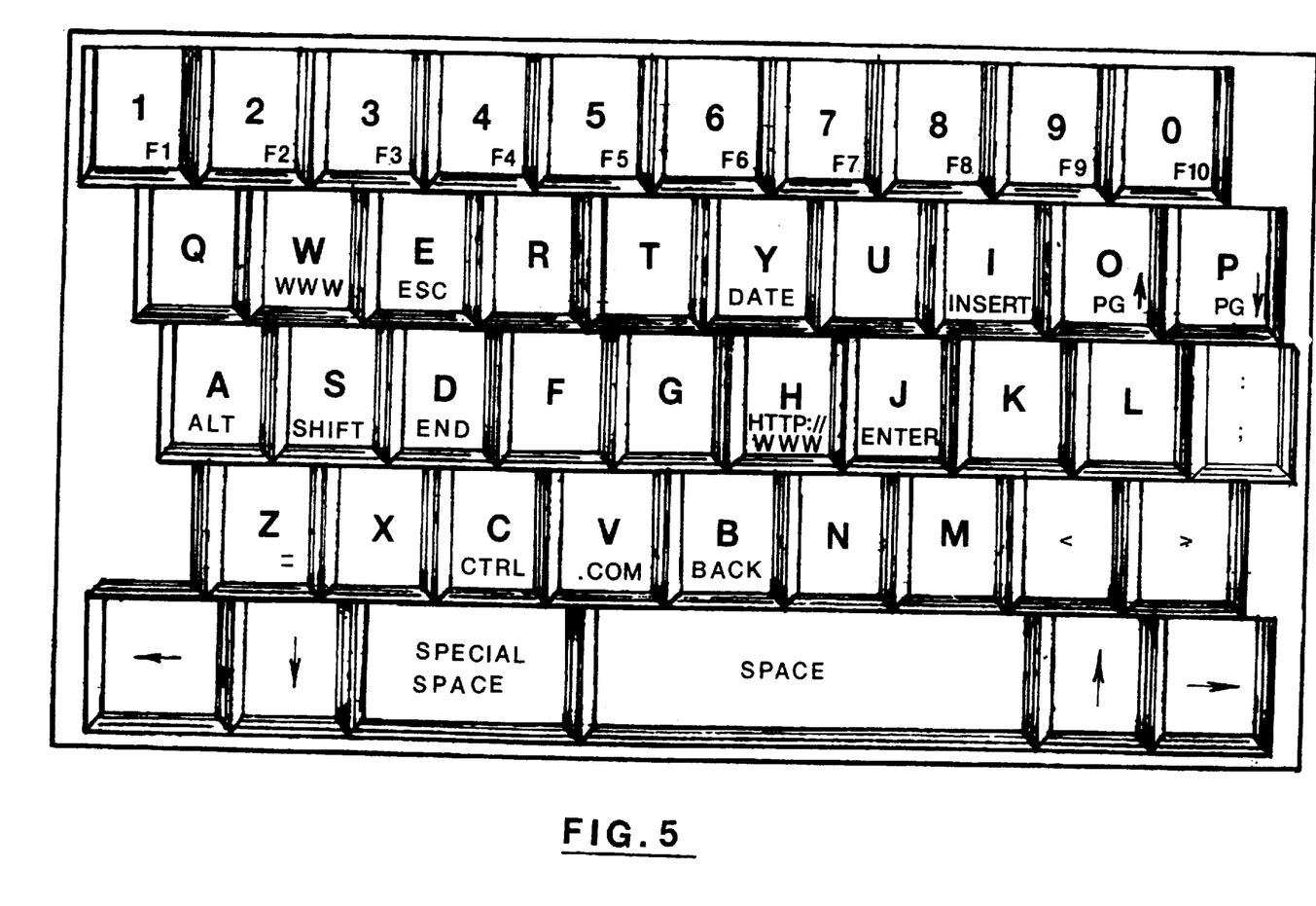
FIG. 5, yet another layout for a second alternative embodiment of a keyboard according to my invention, having no need for shift and enter keys.

In the embodiment of FIG. 3, there are four keys located to the sides of the space key and special key. These keys, known as the arrow keys, when struck in isolation, generate the left, down, right and up cursor movement key codes of the standard ASCII keycode character set. When hit in conjunction with the space key and no other key, they shift as heretofore described and become home, page up, page down, and end keys. When struck in conjunction with the special key and no other key, these keys generate the keycodes associated with the backspace, delete, tab, and back-tab codes of the keycode set. When these keys are found to be struck during the same scan as any modifiable character key, a CONTROL or ALT flag is set, as labelled in the top right hand corner of the key.

The keyboard has a key pitch of at least sixteen millimeters, and preferably a key pitch of either seventeen and eight-tenths or eighteen millimeters, between horizontally adjacent alphanumeric keys with the possible exception of one or two keys at the extreme sides of the keyboard that may be of reduced size.

When the value associated with a key is decremented to zero, the microcontroller generates the keycode of a standard lower case keycode set, such as the ASCII character set or the IBM-PC standard keyboard scan code set, that normally corresponds to this key in the absence of key-modifier keys, and transmits this keycode to the host processor unless the ALT or CONTROL flag is set. In this way, keystrokes are debounced as a key must be released for at least three successive scans, corresponding to a fifteen millisecond key-debounce interval, before it is considered released and corresponding keycodes are sent to the host processor.

When the value associated with a key other than an arrow key is decremented to zero and the ALT or CONTROL flag is set, the microcontroller generates the keycode of an associated ALT or CONTROL key chord in the standard keycode set, and transmits this keycode to the host processor. When a value associated with an arrow key is decremented to zero, the associated ALT or CONTROL flags are cleared.

Whenever the space key is found to be pressed during the same scan as another key, or simultaneously with that other key, the value in memory corresponding to the space key is set to seven, and seven is OR'ed into the current value associated with that other, or modifiable, key if the previous value assigned to that key was not zero (the modifiable key was the first struck of the chord), and fifteen is OR'ed into the current value associated with that other, or modifiable, key if the previous value assigned to that key was zero (the modifiable key was the second struck of the chord).

Similarly, whenever the special key is found to be pressed simultaneously with another modifiable key, the value associated with the special key is set to seven, and the value eleven is OR'ed into the current value associated with that other modifiable key. The preferred embodiment also has a sticky-special mode wherein the value eleven is OR'ed into the current value associated with any other key struck during a user-settable sticky interval following the release of the special key.

Whenever the special key is found to be pressed simultaneously with another modifiable key, the value associated with the special key is zero (indicating that the special key is newly struck), and the value associated with the modifiable key is found to already be eleven, the value twenty-seven is OR'ed into the current value associated with the modifiable key.

Whenever a value associated with a key is decremented from five to four, the value is replaced with zero, the microcontroller generates the keycode of the standard keycode set that normally corresponds to this key in the presence of the common shift key-modifier key, and transmits this keycode to the host processor. Similarly, whenever the value associated with a key is decremented from nine to eight, the value is replaced with zero, the microcontroller generates the keycode of a special function or alternative character associated with this key, and transmits this keycode to the host processor. Similarly, whenever the value associated with a key is decremented from hexadecimal "D" (thirteen) to hexadecimal "C" (twelve), the value is replaced with zero, the microcontroller generates the keycode of the special function or alternative character associated with this key, and transmits this keycode to the host processor. Similarly, when the value associated with a key is decremented from twenty-five to twenty-four, the value associated with that key is replaced with zero, and the microcontroller generates a sequence of keycodes associated with a macro. Predefined macros include common words such as "and", "or", "near", and "not", and frequently used character strings such as "http://", "www.", ".com", and ".net". Other macros may be configured in a RAM through interaction with the user and are transmitted from that RAM when activated.

When the value associated with the space or special keys decrements from one to zero, a keycode corresponding to a space is generated and transmitted to the processor; however, when the value associated with either of these keys decrements from five to four, that value is replaced with zero and no keycode is generated, because this keystroke has been interpreted as part of a chord modifying another key. In sticky-special key mode, no spaces are generated upon the value associated with the special key decrementing from one to zero, instead of timeout counter for the user configurable sticky interval is started.

A shift therefore occurs whenever there is an overlap of the space key and the character key that is to be shifted, with the space key the second struck. The space key generates a space only if it did not overlap with a character key. The user may generate a shifted, or capital letter by holding letter key and tapping the space key.

A few of the special function keycodes thus generated are intercepted before transmission to the host processor, and used to alter the operating mode of the keyboard; in this manner an alpha-numeric key can have the special function of setting or disabling a numeric-lock mode, wherein a portion of the key array is redefined as a 10-key numeric pad. Similarly, a keycode is intercepted and used to toggle a shift-lock keyboard mode.

In the key layout of the preferred embodiment (FIG. 3), the 7, 8, 9, u, i, o, j, k, l, and m keys may thus be redefined as a numeric pad wherein they correspond to numeric keys 7, 8, 9, 4, 5, 6, 1, 2, 3, and 0 with the o, p, and / keys redefined as arithmetic operator keys −, + and * respectively. The / and . keys retain their normal translation, corresponding to the decimal point and divide operators of the numeric pad.

Similarly, a special key combination with a modifiable key, such as Special-M, may be used to set a flag such that a following modifiable key typed within a configurable timeout interval generates a macro string in place of a single character.

The preferred embodiment also has a mode that may be enabled or disabled by the user wherein a macro is generated when certain letters that almost never occur in sequence in the English language, including the "j", "h", "q", "v", and "w" keys, are typed twice within a timeout interval.

The keyboard may be manufactured with a variety of pointer devices in addition to or in place of a standard mouse. It may include an eraser head mouse, a j-key mouse, a glidepoint surface, a pen or a touchscreen.

In an alternative embodiment of my keyboard, the space key operates to generate a space. The special key acts as a sticky shift key, wherein a simultaneous (chorded) strike of the special key, or a strike of the special key within a user configurable timeout interval of a strike of a modifiable character key, acts to produce the standard shifted function of the modifiable character key. In this embodiment, the additional or special function of modifiable character keys is engaged by striking and holding the modifiable character key for a time exceeding a user configurable timeout interval. For example, holding the "N" key for more than half a second causes activation of the num-lock mode without generation of an "n" character. To assist users in learning to use the keyboard, an LED is provided to indicate when the user configurable timeout interval has been exceeded.

In a second alternative embodiment, the space key and special keys each struck alone operate to generate a space. The space key also acts as a shift key, wherein a simultaneous (chorded) strike of the space key and a modifiable character key, acts to produce the standard shifted function of the modifiable character key. In this embodiment, an additional or special function of modifiable character keys is engaged by a simultaneous (chorded) strike of the special key and the modifiable character key.

Yet another alternative embodiment of the keyboard permits shifting with the J and F keys. Any other key tapped while one of these keys is held down generates a shifted character. In this embodiment, the J and F keys have a separate diode connecting them to the output port 13 of the microcontroller. To get a shifted J or F, both are struck, the first key released is the one generated and the other is suppressed.

Where the ASCII character set is stated as the keycode set of the preferred embodiment, the keyboard may also be built to use standard IBM-PC keyboard scan codes for its generated keycode character set.

There are also possible embodiments of the present invention. For example, an eight-bit value field may be allocated in place of the five bit field described, this would permit either greater key-debounce time interval or more precise timing of key debouncing.

Since this invention places many keys in unusual places, it is desirable that mnemonic means be used to aid the user's memory. The preferred version consists of having the first letter of each modified key be the one on which it is placed. For instance, when the ALT key is to be placed on a modifiable key that key will be the a. The same principle will apply to as many of the modified keys as possible. These will include all or most of the following: alt, backspace, control, date, escape, http.//www., insert, lock, on-off, page up, page down, shift, and www. All of these keys will be imprinted on those that are modifiable. It will be noted that http.//www., date, and www. are special in that they are not imprinted on other keyboards. Further, they are programmed into the keyboard and do not need any programming by the user using software.

A key pitch that is even more desirable than 18 mm is one of 19 mm since this is the size found on most standard keyboards.

An LED is described heretofore as the method for giving a signal that a key has been depressed sufficiently long to modify it. Of course, any signal can be used such as a sound or a vibration.

The invention as described uses a split space bar having two sections. Since most people object to having such a split, the space bar can be left intact. Thus, the space bar can act as the modifier key without the use of the special key as a modifier. This also makes it possible to use on ergonomic keyboards which have two sections of a space bar divided from each other. The many features of this keyboard can be used on any sized keyboard to eliminate the need for removing the fingers from the home keys.

This keyboard can also have a number of smaller-sized keys if needed as long as they are keys that are seldom used and not prevent touch-typing.

Modifiable keys can also be modified by striking or pressing them simultaneously with any key the user chooses.

The arrow keys can function as a mouse by making them so that both the horizontal and vertical keys can be actuated simultaneously. Their effectiveness can be enhanced by using an optional feature of varying the speed of the cursor as pressure on the arrow keys is varied.

The keys can be shifted by use of special and space keys or shifted by holding them down. Another keystroke saving method can be used on this keyboard which consists of having additional macros programmed into the keyboard and displayed on the respective key or keys. These macros can consist of seven of the most commonly used words; the, that, and, to, of, is, and in. By programming these words including spaces before and after them, a study shows they will save as much as ten percent of keystrokes. Just the use of the word "the" should save two percent.

Some mnemonic modified keys have the same first letter. In order to use the modifiable key to contain two of them, any of the modifier methods can be used. Then, the shift would be actuated to give the second modification which would be remembered by its alphabetical order. The same effect can be achieved by holding down the modifier key to change to the next modification. This permits a virtually infinite number of macros to be used on the keyboard. An example of the use of these methods would be found on the letter "t". The first modification would be for the tab, the second for that, and the third for the.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

What is claimed is:

1. An electronic keyboard, comprising:
   a frame;
   a plurality of alphanumeric keys operatively connected to said frame;
   a thumb-operable spacebar operatively connected to said frame and having at least a portion thereof used in conjunction with one or more said alphanumeric keys being modifiable character keys, to generate a second function on such for at least one of said keys; and
   wherein the spacebar portion comprises a space key, which when pressed alone generates a space, when pressed first and simultaneously held while a modifiable character key is pressed generates a special function of the modifiable character key, and when an alphanumeric key is pressed first and simultaneously held while the space key is pressed generates a shifted version of the character of the alphanumeric key.

2. An electronic keyboard according to claim 1, wherein: the alphanumeric keys are arranged into rows in the standard "QWERTY" arrangement with a horizontal pitch between key centers in each row being at least sixteen millimeters;
   the spacebar is arranged below said alphanumeric keys; and
   the functions of key-modifier and special character keys usually located at the sides of a standard keyboard are incorporated as second functions of the modifiable character keys.

3. An electronic keyboard, comprising:
   a frame;
   a plurality of alphanumeric keys operatively connected to said frame;
   a thumb-operable spacebar operatively connected to said frame and having at least a portion thereof used in conjunction with one or more said alphanumeric keys being modifiable character keys, to generate a second function on such for at least one of said keys;
   wherein the spacebar portion comprises a space key, which when pressed alone generates a space, when pressed first and simultaneously held while a modifiable character key is pressed generates a special function of the modifiable character key, and when an alphanumeric key is pressed first and simultaneously held while the space key is pressed generates a shifted version of the character of the alphanumeric key; and
   wherein the spacebar includes a second portion which comprises a special key, which when pressed first and simultaneously held while a modifiable character key is pressed generates the special function of the modifiable character key.

4. An electronic keyboard according to claim 3, wherein the special function of a modifiable character key is a num-lock function, which remains in effect until an event occurs selected from the group of events consisting of turned off by the user, a user-configurable time interval expires from the last keypress, and the keyboard is reset.

5. An electronic keyboard according to claim 3, wherein a macro can be generated by pressing first and simultaneously holding a modifiable character key while the special key is pressed twice.

6. An electronic keyboard according to claim 3, wherein the special key remains activated for a predetermined period of time after pressing.

7. An electronic keyboard according to claim 6, further including a signal which indicates the time period during which the special key is activated.

8. An electronic keyboard according to claim 6, wherein the time period during which the special key remains activated can be set by the user.

9. An electronic keyboard according to claim 3, wherein the alphanumeric keys are arranged into rows in the standard "QWERTY" arrangement with a horizontal pitch between key centers in each row being at least sixteen millimeters;
   the spacebar is arranged below said alphanumeric keys; and
   the functions of key-modifier and special character keys usually located at the sides of a standard keyboard are incorporated as special functions of the modifiable character keys.

10. An electronic keyboard according to claim 3, wherein the mapping of the spacebar portions into the space key and the special key is configurable by the user.

11. An electronic keyboard, comprising:

a frame;

a plurality of alphanumeric keys operatively connected to said frame;

a thumb-operable spacebar operatively connected to said frame and having at least a portion thereof used in conjunction with one or more said alphanumeric keys being modifiable character keys, to generate a second function on such for at least one of said keys;

wherein the spacebar portion comprises a space key, which when pressed alone generates a space, when pressed first and simultaneously held while a modifiable character key is pressed generates a special function of the modifiable character key, and when an alphanumeric key is pressed first and simultaneously held while the space key is pressed generates a shifted version of the character of the alphanumeric key; and wherein a special function of one modifiable character key is a num-lock function, which remains in effect until an event occurs selected from the group of events consisting of until turned off, a user-configurable time interval expires from the last keypress, and the keyboard is reset.

12. An electronic keyboard, comprising:

a frame;

a plurality of alphanumeric keys operatively connected to said frame;

a thumb-operable spacebar operatively connected to said frame and having at least a portion thereof used in conjunction with one or more said alphanumeric keys being modifiable character keys, to generate a second function on such for at least one of said keys; and wherein the spacebar includes a second portion which comprises a special key, which when pressed first and simultaneously held while a modifiable character key is pressed generates the special function of the modifiable character key.

13. An electronic keyboard according to claim 12, wherein the special function of one modifiable character key is a num-lock function which remains in effect until an event occurs selected from the group of events consisting of until turned off, a user-configurable time interval expires from the last keypress, and the keyboard is reset.

14. An electronic keyboard according to claim 12, wherein the special key remains activated for a predetermined period of time after pressing.

15. An electronic keyboard according to claim 14, further including a signal which indicates the time period during which the special key is activated.

16. An electronic keyboard according to claim 14, wherein the time period during which the special key remains activated can be set by the user.

17. An electronic keyboard according to claim 12, wherein the alphanumeric keys are arranged into rows in the standard "QWERTY" arrangement with a horizontal pitch between key centers in each row being at least sixteen millimeters;

the spacebar is arranged below said alphanumeric keys; and the functions of key-modifier and special character keys usually located at the sides of a standard keyboard are incorporated as second functions of some of the alphanumeric keys.

18. An electronic keyboard comprising:

a frame;

a plurality of alphanumeric keys operatively connected to said frame, wherein a special function of one or more of said alphanumeric keys, being modifiable character keys, can be activated by pressing and holding said modifiable character key until a user-configurable time interval expires; and a thumb-operable spacebar operatively connected to said frame and having a first portion comprising a space key which when pressed generates a space, and a second portion comprising a special key which remains activated for a period of time after pressing set by the user, which when pressed and a alphanumeric key is pressed within the set time period produces the standard shifted function of said alphanumeric key.

19. An electronic keyboard according to claim 18, further including a signal which indicates the time period during which the special key is activated.

20. An electronic keyboard according to claim 18, wherein the alphanumeric keys are arranged into rows in the standard "QWERTY" arrangement with a horizontal pitch between key centers in each row being at least sixteen millimeters;

the spacebar is arranged below said alphanumeric keys; and the functions of key-modifier and special character keys usually located at the sides of a standard keyboard are incorporated as second functions of some of the alphanumeric keys, being modifiable character keys.

21. An electronic keyboard according to claim 20, wherein the alphanumeric keys are arranged into rows in the standard "QWERTY" arrangement with a horizontal pitch between key centers in each row being at least sixteen millimeters;

the spacebar is arranged below said alphanumeric keys; and the functions of key-modifier and special character keys usually located at the sides of a standard keyboard are incorporated as second functions of some of the alphanumeric keys, being modifiable character keys.

22. A method according to claim 21, wherein:

the alphanumeric keys provided are in rows with a horizontal pitch between key centers of at least 16 mm; and the footprint of the keys of the keyboard is no more than eight and one-half inches in length.

23. An electronic keyboard comprising:

a frame;

a plurality of alphanumeric keys operatively connected to said frame;

a thumb-operable spacebar operatively connected to said frame and having a first portion comprising a space key which when pressed alone generates a space, when pressed simultaneously pressed with an alphanumeric key produces a shifted function of the alphanumeric key, and a second portion comprising a special key which when pressed alone generates a space, when simultaneously pressed with an alphanumeric key having a special function, being a modifiable character key, produces said special function of the modifiable character key.

* * * * *